(12) United States Patent
Choi et al.

(10) Patent No.: US 6,478,578 B2
(45) Date of Patent: Nov. 12, 2002

(54) APPARATUS FOR BAKING WAFERS

(75) Inventors: Il-Jung Choi, Kyunggi-do (KR); Kwang-Soo Hwang, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/895,220

(22) Filed: Jul. 2, 2001

(65) Prior Publication Data

US 2002/0102511 A1 Aug. 1, 2002

(30) Foreign Application Priority Data

Jan. 31, 2001 (KR) .............................................. 01-4585

(51) Int. Cl.[7] .............................................. F27D 5/00
(52) U.S. Cl. ......................... 432/253; 432/258; 219/443
(58) Field of Search ........................... 432/5, 253, 258; 118/724, 725; 219/405, 311, 497, 443, 445

(56) References Cited

U.S. PATENT DOCUMENTS 6,313,441 B1 * 11/2001 Schaper et al. ............. 219/390
RE37,470 E * 12/2001 Ohkura et al. .............. 118/500
6,402,509 B1 * 6/2002 Ookura et al. .............. 432/253

* cited by examiner

*Primary Examiner*—Gregory Wilson
(74) *Attorney, Agent, or Firm*—Volentine Francos, PLLC

(57) ABSTRACT

An apparatus for baking a wafer includes a heating plate for supporting the wafer to be baked, a lifting device for loading and unloading the wafer onto and from the upper surface of the heating plate, and a detector for detecting whether the wafer loaded by the lifting device onto the upper surface of the heating plate extends parallel to the upper surface, i.e., is situated correctly on the heating plate. The detector includes proximity sensors and a controller. The proximity sensors are disposed in or on the heating plate for sensing respective distances from the positions thereof to the wafer and generating signals indicative of whether the wafer is disposed more than a predetermined distance away from the sensors. The controller determines, on the basis of the signals generated by the proximity sensors, whether the baking process should be carried out and controls the baking process once it is initiated.

14 Claims, 6 Drawing Sheets

APPARATUS FOR BAKING WAFERS

BACKGROUND OF THE INVENTION

1. Field of the Invention

The present invention relates to the manufacturing of semiconductor devices. More particularly, the present invention relates to an apparatus for baking wafers.

This is a counterpart of Korean Patent Application No. 2001-4585, filed Jan. 31, 2001, the contents of which are incorporated herein by reference in their entirety.

2. Description of the Related Art

Spin-coating equipment for use in photolithography typically include apparatus for baking a spin-coated wafer. In general, such an apparatus performs various baking processes such as pre-bake and post-bake processes.

Referring to FIG. 1A and FIG. 1B, an apparatus 10 for baking wafers generally comprises a chamber, a heating plate 12 disposed in the chamber for supporting a wafer 30 thereon, and a lifting device (not shown) having lifting pins for loading and unloading the wafer 30 onto and from the heating plate 12. The lifting pins of the lifting device extend through the heating plate 12 and are movable up and down relative to the heating plate 12. Thus, after the wafer 30 is loaded onto the lifting pins by a robot, the lifting pins can be lowered until the wafer 30 is placed on the upper surface of the heating plate 12.

However, the upper surface of the heating plate 12 is sometimes slightly inclined. In such a case, the wafer 30 can slide along the upper surface of the heating plate 12 as the lifting pins are being lowered. A guide 14 comprising a plurality of guide pins is disposed along the periphery of the heating plate 12 to prevent the wafer 30 from sliding off of the heating plate 12 as it is being placed thereon.

However, the guide 14 may present another problem in connection with the positioning of the wafer 30 on the heating plate 12. For example, an error can be made in setting the robot to transfer the wafer to the desired position or the robot itself may experience a mechanical error. When either of these errors occur, the wafer 30 can be incorrectly placed on the heating plate 12, i.e., a portion of the wafer 30 can be set atop one of the guide pins of the guide 14 as shown in FIG. 1B. As a result, the wafer 30 will not be heated evenly during the bake process. Consequently, the thickness of the resulting photo-resist (TPR) will vary beyond the design tolerance or the critical dimension (CD) of the wafer will vary. In the worst case, a pattern bridge will form on the wafer or a portion of the wafer designated to be patterned will not in fact be patterned.

Thus, the improper placement of the wafer on the heating plate 12 can lead to serious defects in the wafer 30. Up until now, such defects have only been uncovered as the result of a check of the production rate or an inspection that is made after the overall manufacturing process is completed. That is, production processes are continuously carried out on a wafer before it is discovered that a defect was produced in the wafer as the result of the improper placing of the wafer on the heating plate. Obviously, fabricating wafers of inferior quality before the cause of a defect in the wafers is uncovered lowers the production rate.

SUMMARY OF THE INVENTION

Accordingly, an object of the present invention is to provide an improved apparatus for baking a wafer, which apparatus can prevent a defect from being formed on the wafer as the result of an incorrect placement of the wafer on the heating plate of the apparatus, thereby ensuring that quality semiconductor devices are manufactured from the wafer and contributing to the productivity of the manufacturing process.

To achieve this object, the present invention provides an apparatus for baking a wafer, which apparatus can detect whether the wafer is situated correctly on the heating plate.

The apparatus for baking a wafer according to the present invention includes the heating plate on which the wafer is to be supported horizontally during the baking process, a lifting device associated with the heating plate for loading and unloading the wafer onto and from the heating plate, and means for detecting whether the wafer loaded onto the heating plate by the lifting device extends parallel to the upper surface of the heating plate.

The detecting means includes at least two proximity sensors spaced at uniform intervals from one another in or on the heating plate. The proximity sensors sense the respective distances from the locations thereof to the wafer and generate signals representative of the sensed distances. The detecting means also includes a controller for determining whether the wafer is situated correctly on the heating plate and hence, whether a manufacturing process should be carried out, on the basis of the signals generated by the proximity sensors. The controller is also connected to the working elements of the apparatus, e.g. the heater, to control the manufacturing process.

In the present invention, the proximity sensors are mounted, respectively, in grooves in the upper surface of the heating plate. Preferably, the entirety of each proximity sensor, with the exception of a sensing surface thereof, is disposed within the heating plate beneath a respective groove in the upper surface of the plate. The sensing surface is exposed within the groove and becomes the only exposed surface of the sensor. Specifically, the sensing surface is preferably disposed 0.5 mm from the upper surface of the heating plate. The grooves can be disposed along lines that emanate from the center of the heating plate and subtend equal angles of 120 degrees.

Also, the controller can generate an alarm in the form of a sound or a visual alarm message when at least one of the proximity sensors fails to produce a signal indicating that the wafer is disposed no further than a predetermined distance therefrom.

BRIEF DESCRIPTION OF THE DRAWINGS

These and other objects, features and advantages of the present invention will become more apparent from the following detailed description of the preferred embodiment thereof made with reference to the attached drawings, of which.

DETAILED DESCRIPTION OF THE PREFERRED EMBODIMENT

The present invention now will be described more fully hereinafter with reference to the accompanying drawings. Like numbers refer to like elements throughout the drawings.

Figure 1A:
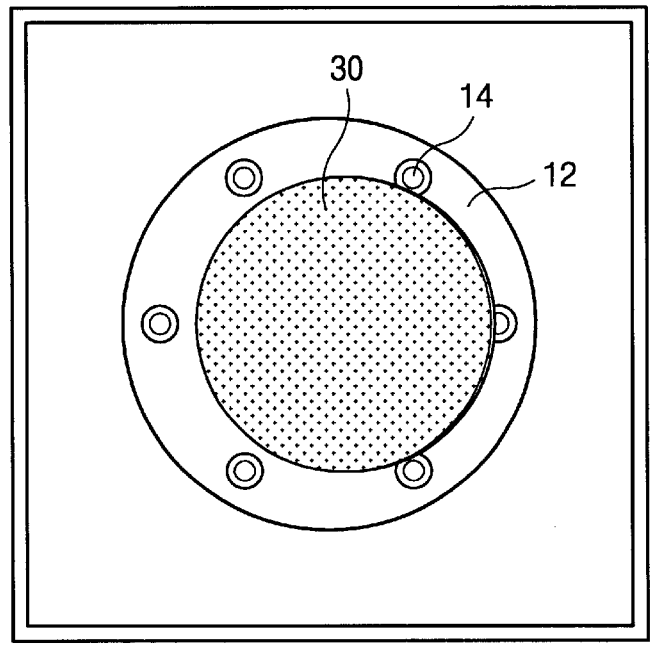
FIG. 1A is a plan view of a prior art apparatus for baking wafers.
Figure 1B:
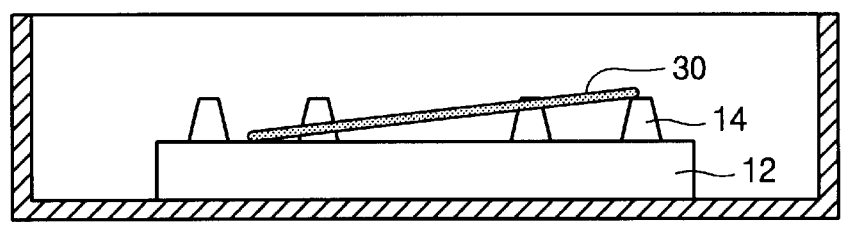
FIG. 1B is a sectional view of the prior art apparatus for baking wafers.
Figure 2:
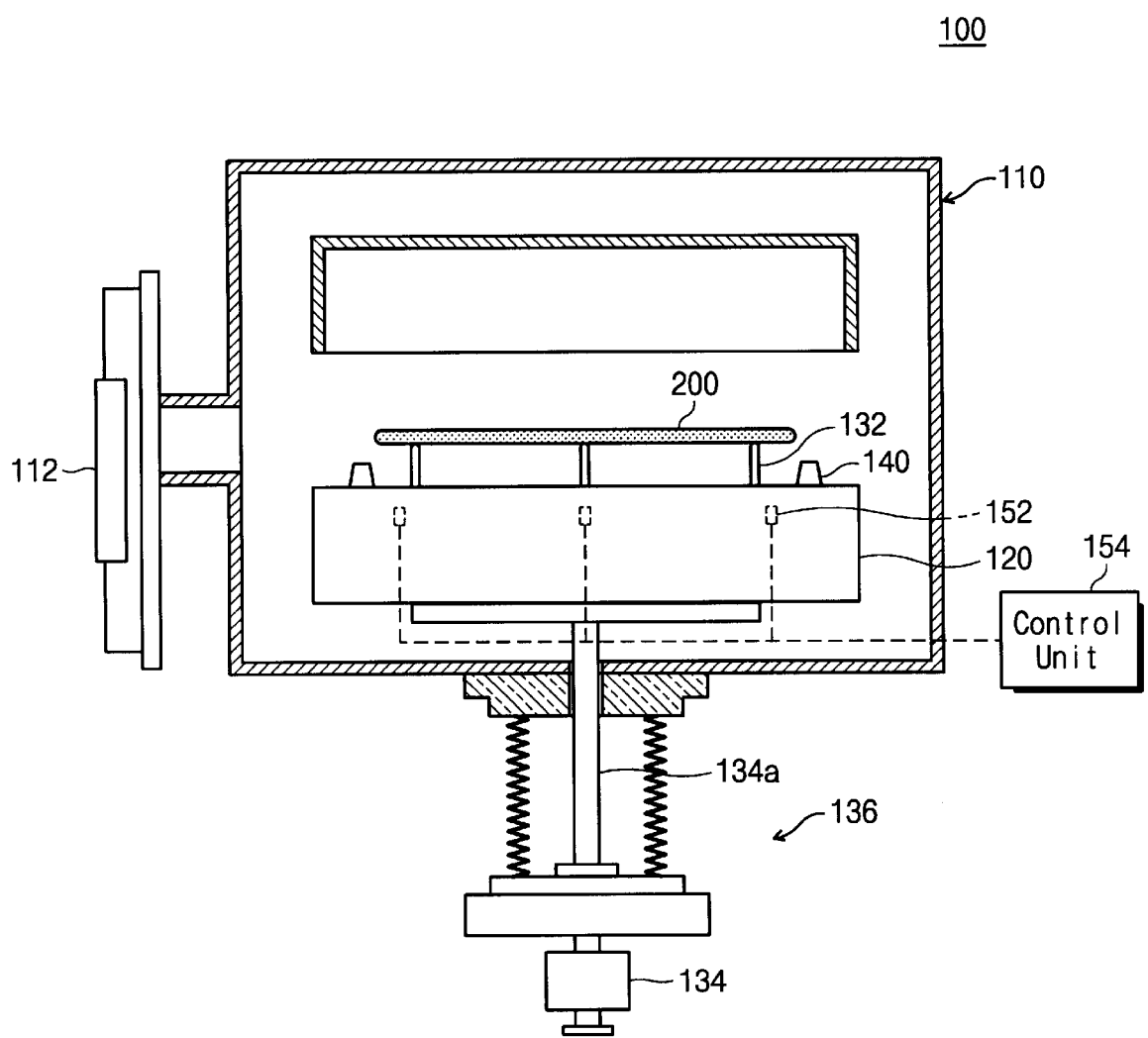
FIG. 2 is a sectional view of an apparatus for baking wafers according to the present invention.
Figure 3:
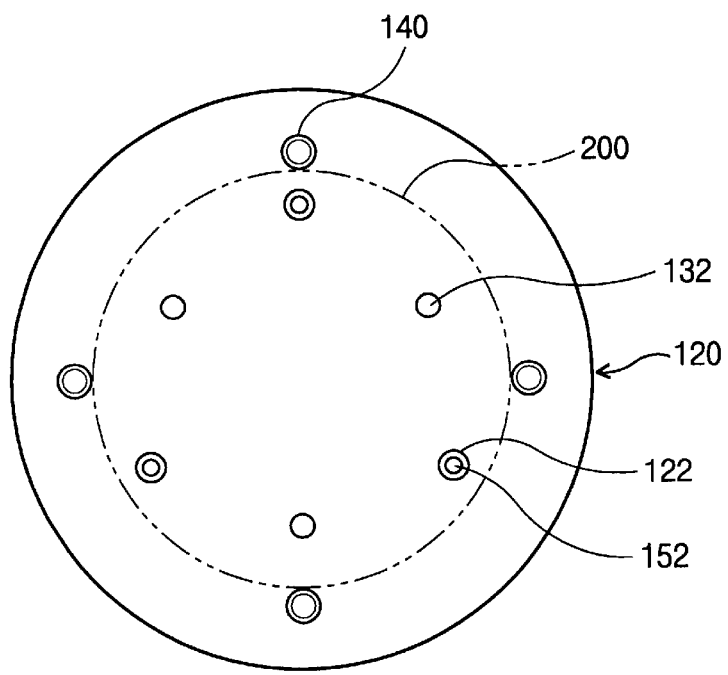
FIG. 3 is a plan view of a heating plate of the apparatus for baking wafers according to the present invention.
Figure 4:
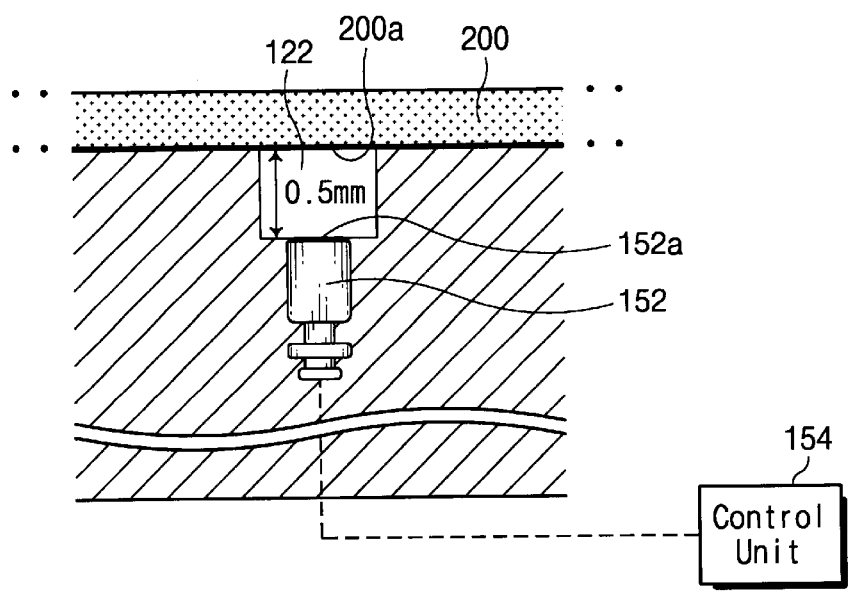
FIG. 4 is a partial cross-sectional view of the heating plate, showing one of sensors disposed in the heating plate.

Referring now to FIG. 2 to FIG. 4, an apparatus 100 for baking wafers according to present invention comprises a chamber 110, a heating plate 120 for heating a wafer 200 placed thereon, a lifting device 136 for loading the wafer 200 onto and unloading the wafer 200 from the heating plate 120, a guide 140 for preventing a wafer loaded on the heating plate 120 from moving along the surface of the heating plate 120, and a detector for detecting whether a wafer loaded onto the heating plate 120 by the lifting device 136 extends parallel to the upper surface of the heating plate 120.

The chamber 110 of the apparatus 100 includes a gate 112 for allowing a wafer 200 to be transferred into and out of the chamber. The heating plate 120 is disposed in the chamber 110.

The lifting device 136 of the apparatus 100 comprises three lifting pins 132, and a cylinder 134. The lifting pins 132 extend, respectively, into three holes formed in the peripheral portion of the heating plate 120. Also, the lifting pins 132 are connected to a vertically reciprocatable piston 134a of the cylinder 134 such that the pins 132 can be moved up and down through the holes of the heating plate 120.

The guide 140 of the apparatus 100 comprises four guide pins disposed at the periphery of the heating plate 120 along a circle having a center coincident with that of the heating plate 120. The guide pins function to support the side surface of the wafer 200 as it is loaded onto the heating plate 120.

Referring now to FIG. 3 and FIG. 4, the detector of the apparatus 100 functions to detect whether the wafer 200 is leaning or is disposed correctly on the heating plate 120. To this end, the detector comprises three sensors 152 disposed in or on the heating plate 120, and a control unit (computer controller) 154 operatively connected to the sensors 152.

The sensors 152 are disposed, respectively, in association with three grooves 122 defined in the upper surface of the heating plate 120. The grooves have a predetermined depth of, for example, 0.5 mm. Furthermore, the grooves 122 and hence, the sensors 152, are disposed along radial lines extending from the center of the heating plate 120 and subtending equal angles of 120 degrees, and all lie in a circle having a diameter smaller than that of the wafer 200 to be processed in the apparatus 100. It should be noted, however, that the apparatus 100 is not limited to having three grooves 122 and sensors 152. Rather, the apparatus 100 may have two or more grooves 122 and sensors 152, and the sensors 152 and grooves 122 of any number are preferably disposed at equal angular intervals in the heating plate 120.

Each sensor 152 is a proximity sensor which senses the distance from a sensing surface 152a thereof to the bottom surface of the wafer 200, i.e., whether the bottom surface of the wafer 200 is located a predetermined distance from the sensing surface is 152a thereof. The proximity sensor also generates a corresponding signal, i.e., an ON or OFF signal, according to the sensed distance or state. To this end, the proximity sensor employs a capacitive sensor. As shown in FIG. 4, to exclude noise from lateral directions, each sensor 152 is preferably embedded in the heating plate 120 below a groove 122 with only the sensing surface 152a thereof being exposed.

The sensors 152 are connected with the control unit 154. The control unit 154 determines whether a baking process should be carried out based on the ON/OFF signals from the sensors 152, i.e., determines whether a wafer 200 extends parallel to the upper surface of the heating plate 120. The control unit also controls the baking process itself. When at least one of the sensors 152 does not generate a signal, i.e., generates an OFF signal, the control unit 154 generates an alarm in the form of a signal, a sound, or an alarm message that can be seen on a display (not shown).

The operation of the apparatus 100 for baking wafers according to the present invention will now be described.

Figure 7:
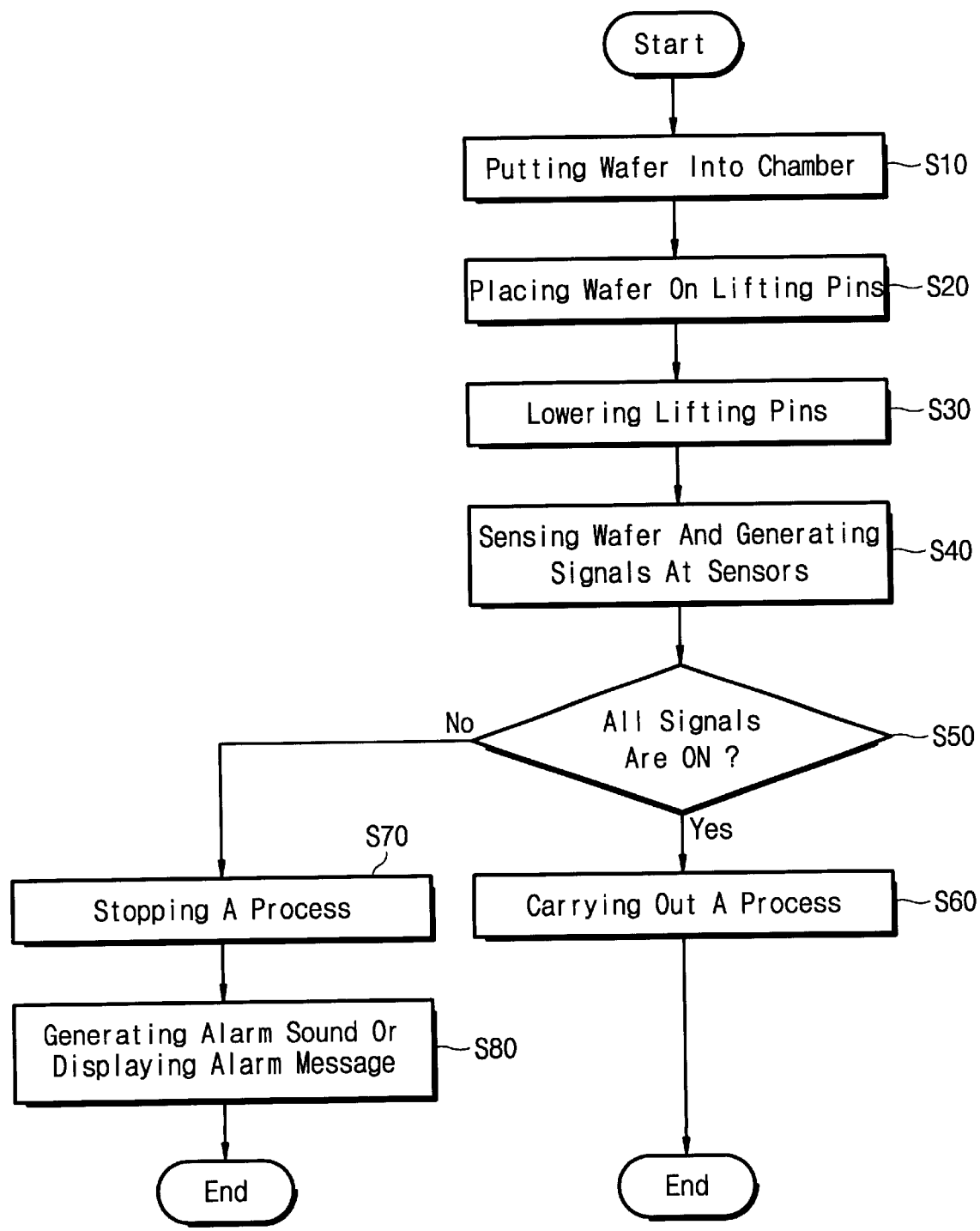
FIG. 7 is a flow chart of a bake process performed by the apparatus for baking wafers according to the present invention.

Referring to FIG. 7, first a wafer 200 is transported into the chamber 110 through the gate 110 of the chamber (S10). The wafer 200 is then placed on the three lifting pins 132 of the lifting device 136, which lifting pins 132 have been raised so as to project upwardly from the heating plate 120 (S20). The lifting pins 132 are then lowered to set the wafer 200 on the heating plate 120 (S30) in preparation for a baking process. Then, each sensor 152 of the detector senses the distance from the sensing surface 152a thereof to the bottom surface of the wafer 200, and generates an ON or OFF signal according to the sensed distance (S40). The control unit 154 determines whether all of the signals produced by the sensors 152 are ON signals (S50). If all of the signals are ON signals, the wafer 200 is judged to be disposed correctly on the heating plate 120 as extending parallel to the upper surface thereof and the baking process is carried out (S60). However, if at least one of the signals produced by the sensors 152 is an OFF signal, the baking process is not initiated (S70), and the control unit 154 generates an alarm (S80).

Figure 5A:
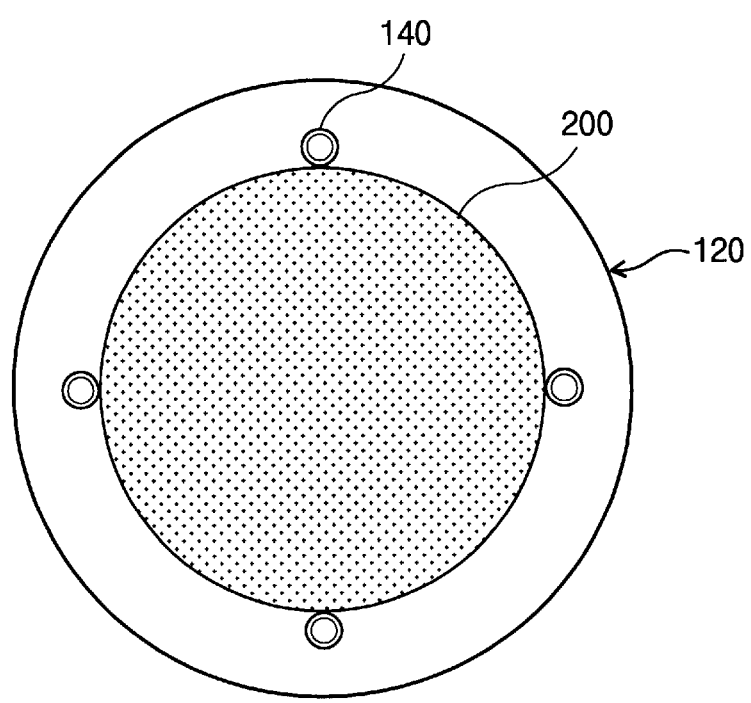
FIG. 5A and FIG. 5B are plan and side views, respectively, of the heating plate of the apparatus for baking wafers according to the present invention, illustrating a state in which a wafer is disposed normally on the heating plate.
Figure 5B:
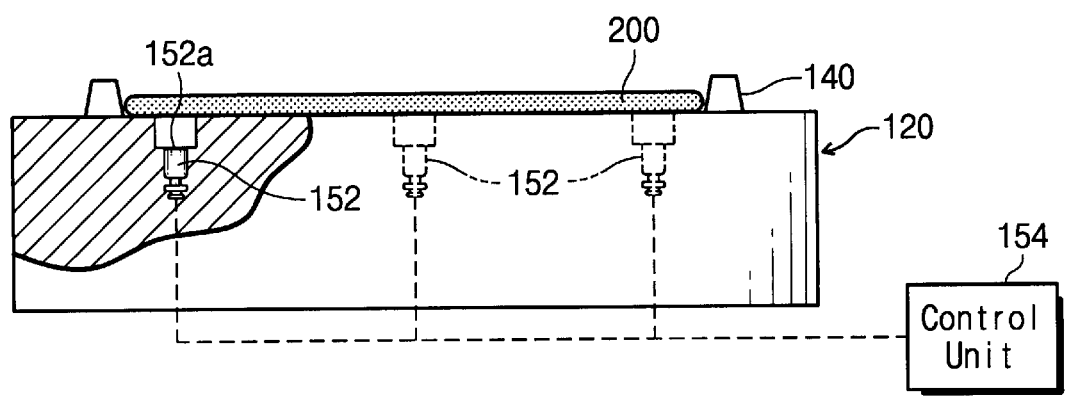

More specifically, when the wafer 200 is placed correctly on the heating plate 120 as shown in FIG. 5A and FIG. 5B, all of the sensors 152 sense that the bottom surface of the wafer 200 is located a predetermined distance (corresponding to the depth of the groove 122) from the respective sensing surfaces 152a thereof, and generate ON signals. Consequently, the control unit 154 initiates the process of baking the wafer 200.

Figure 6B:
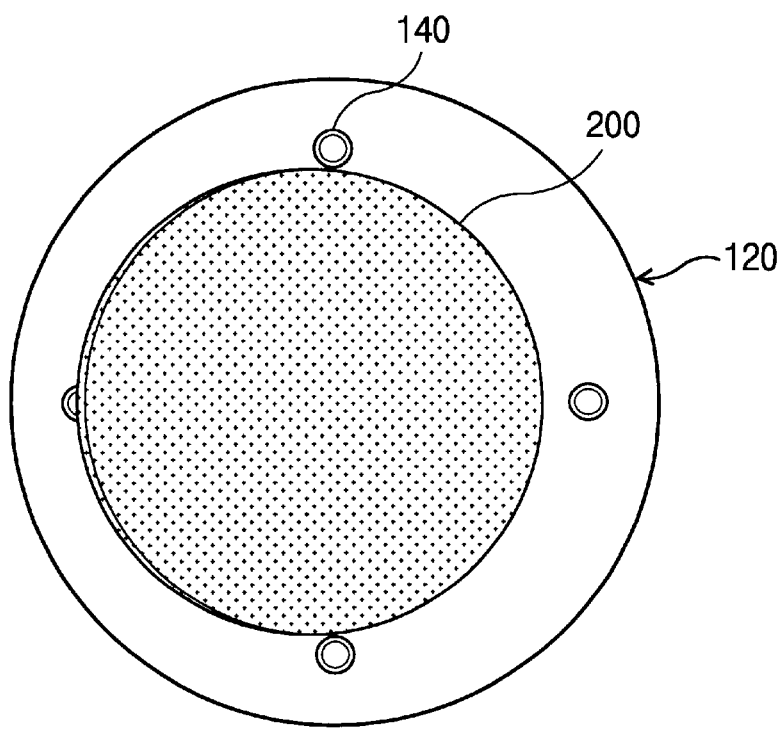
FIG. 6A and FIG. 6B are plan and side views, respectively, of the heating plate, illustrating a state in which a wafer is leaning on the heating plate.
Figure 6A:
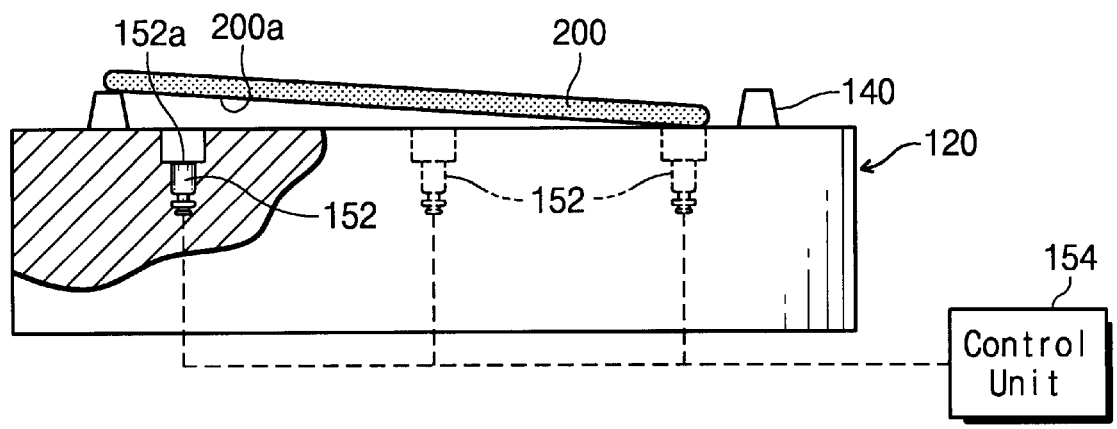

However, when the wafer 200 is set atop one of guide pins 140 due to a setting error or a mechanical error of the robot itself, such that the wafer 200 is leaning as shown in FIG. 6A and FIG. 6B, the portion of the wafer 200 resting on the guide pin 140 is located beyond sensing limit of the sensor. Accordingly, the sensor 152 disposed closest to the portion of the wafer 200 resting on the guide pin 140 can not sense the bottom surface of the wafer 200 and thus, generates an OFF signal. The OFF signal is received by the control unit 154. As a result, the baking process is stopped and the alarm is generated.

As is can be appreciated from the foregoing description, the apparatus for baking a wafer according to the present invention prevents wafer defects due to the incorrect placing of the wafer on the heating plate. The present invention can also inform an operator to correct the cause of such defects, for example, an error by a robot for transferring the wafer. Accordingly, the present invention can improve the quality of semiconductor devices and productivity of the overall manufacturing process thereof.

Finally, although the present invention has been shown and described with respect to the preferred embodiment thereof, the invention may nonetheless be embodied in many different forms. Accordingly, all such forms of the invention as encompassed by the following claims are seen to be within the true spirit and scope of the invention.

What is claimed is:

1. An apparatus for baking a wafer, comprising:
   a heater comprising a heating plate having a horizontal upper surface on which a wafer rests while being baked in the apparatus;
   a lifting device operatively associated with said heating plate for loading a wafer onto and unloading the wafer from the upper surface of said heating plate;
   a detector disposed relative to said heating plate so as to detect whether a wafer loaded onto the upper surface of said heating plate by said lifting device extends parallel to the upper surface of said heating plate;
   wherein said detector comprises at least two sensors spaced apart from one another about said heating plate at positions adjacent the upper surface of said heating plate, each of said sensors being operative to sense whether a wafer is located within a predetermined distance from the position of the sensor, and each of said sensors being operative to generate a signal indicative of whether the wafer is located within the predetermined distance from the position of the sensor; and
   a controller connected to said sensors so as to receive the signals generated thereby and operative to determine, based on said signals, whether the wafer is lying flat on the upper surface of said heating plate.

2. The apparatus for baking a wafer according to claim 1, wherein said heating plate has at least two grooves in said upper surface thereof, and said sensors are disposed, respectively, in positions associated with said grooves.

3. The apparatus for baking a wafer according to claim 2, wherein said grooves are disposed along lines emanating from the center of the upper surface of said heating plate and subtending equal angles of 120 degrees with each other.

4. The apparatus for baking a wafer according to claim 3, wherein each of said sensors is a proximity sensor having a sensing surface and operative to sense the distance from the sensing surface to the bottom surface of a wafer disposed on the heating plate.

5. The apparatus for baking a wafer according to claim 4, wherein said proximity sensors are capacitive sensors.

6. The apparatus for baking a wafer according to claim 2, wherein each of said sensors has a sensing surface from which the sensor operates, and each of said sensors is embedded in said heating plate below a respective one of said grooves in the upper surface of the heating plate with only the sensing surface of the sensor being exposed, the sensing surface being exposed in the respective groove.

7. The apparatus for baking a wafer according to claim 2, wherein each of said sensors is a proximity sensor having a sensing surface from which the sensor operates, the sensing surface of each of said proximity sensors being disposed 0.5 mm from the upper surface of said heating plate.

8. The apparatus for baking a wafer according to claim 2, wherein each of said sensors is a proximity sensor having a sensing surface and operative to sense the distance from the sensing surface to the bottom surface of a wafer disposed on the heating plate.

9. The apparatus for baking a wafer according to claim 8, wherein said proximity sensors are capacitive sensors.

10. The apparatus for baking a wafer according to claim 1, wherein said controller is operative to generate an alarm when the controller determines that the wafer is disposed more than the predetermined distance from at least one of said sensors.

11. The apparatus for baking wafer according to claim 1, wherein said sensors are disposed along lines emanating from the center of the upper surface of said heating plate and subtending equal angles of 120 degrees with each other.

12. The apparatus for baking a wafer according to claim 1, and further comprising a guide disposed on the upper surface of said heating plate and configured to prevent a wafer from moving after the wafer is loaded onto the upper surface of said heating plate.

13. The apparatus for baking a wafer according to claim 1, wherein each of said sensors is a proximity sensor having a sensing surface and operative to sense the distance from the sensing surface to the bottom surface of a wafer disposed on the heating plate.

14. The apparatus for baking a wafer according to claim 13, wherein said proximity sensors are capacitive sensors.

* * * * *